(12) United States Patent
Tiwari et al.

(10) Patent No.: US 9,057,144 B2
(45) Date of Patent: Jun. 16, 2015

(54) NANOSTRUCTURED FILMS AND RELATED METHODS

(75) Inventors: Ashutosh Tiwari, Sandy, UT (US); Michael Snure, Dayton, OH (US); Makarand Karmarkar, Salt Lake City, UT (US)

(73) Assignee: UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 0 days.

(21) Appl. No.: 13/813,022

(22) PCT Filed: Jul. 29, 2011

(86) PCT No.: PCT/US2011/045925
§ 371 (c)(1),
(2), (4) Date: Jan. 30, 2013

(87) PCT Pub. No.: WO2012/016160
PCT Pub. Date: Feb. 2, 2012

(65) Prior Publication Data
US 2013/0161614 A1    Jun. 27, 2013

Related U.S. Application Data

(60) Provisional application No. 61/369,150, filed on Jul. 30, 2010.

(51) Int. Cl.
*H01L 21/00* (2006.01)
*C25D 11/26* (2006.01)
(Continued)

(52) U.S. Cl.
CPC ............... *C25D 11/26* (2013.01); *C25D 21/10* (2013.01); *H01L 31/032* (2013.01); *C25D 5/02* (2013.01);

(Continued)

(58) Field of Classification Search
CPC ....... H01L 31/032; C25D 11/02; C25D 21/10
USPC ............................................ 257/43; 438/73
See application file for complete search history.

(56) References Cited

U.S. PATENT DOCUMENTS 5,441,627 A * 8/1995 Kato et al. ...................... 205/77
7,208,327 B2 * 4/2007 Gstrein et al. .................. 438/10
(Continued)

FOREIGN PATENT DOCUMENTS

JP          2007098563 A  *  4/2007
JP          2009-519204 A    5/2009
WO       WO 2009151124 A1 * 12/2009

OTHER PUBLICATIONS

International Search Report and Written Opinion issued in PCT/US2011/045925, Feb. 24, 2012.
(Continued)

*Primary Examiner* — Matthew Landau
*Assistant Examiner* — Igwe U Anya
(74) *Attorney, Agent, or Firm* — Michael Best & Friedrich LLP (57) ABSTRACT

Nanostructured films including a plurality of nanowells, the nanowells having a pore at the top surface of the film, the pore defining a channel that extends downwardly towards the bottom surface of the film are provided. Also provided are methods including exposing a growth substrate to an anodizing bath, applying ultrasonic vibrations to the anodizing bath, and generating a current through the anodizing bath to form the nanostructured film. The nanostructured films may be formed from $TiO_2$ and may be used to provide solid state dye sensitized solar cells having high conversion efficiencies.

8 Claims, 10 Drawing Sheets

(51) Int. Cl.
    *C25D 21/10*     (2006.01)
    *H01L 31/032*     (2006.01)
    *C25D 5/02*     (2006.01)
    *C25D 11/02*     (2006.01)
    *H01G 9/20*     (2006.01)
    *H01M 14/00*     (2006.01)
    *H01L 51/00*     (2006.01)

(52) U.S. Cl.
    CPC ............ *C25D 11/02* (2013.01); *H01G 9/2031* (2013.01); *H01G 9/2036* (2013.01); *H01G 9/2059* (2013.01); *H01L 51/0086* (2013.01); *Y02E 10/542* (2013.01); *H01M 14/005* (2013.01)

(56) References Cited

U.S. PATENT DOCUMENTS

| | | | |
|---|---|---|---|
| 7,572,400 B2* | 8/2009 | Fujikawa et al. | 264/220 |
| 7,820,908 B2 | 10/2010 | Kang et al. | |
| 8,518,420 B2* | 8/2013 | Biris | 424/400 |
| 8,821,700 B2* | 9/2014 | Kuroha et al. | 204/248 |
| 2005/0098205 A1* | 5/2005 | Roscheisen et al. | 136/263 |
| 2009/0090411 A1* | 4/2009 | Choi et al. | 136/252 |
| 2010/0084014 A1* | 4/2010 | Roscheisen et al. | 136/256 |
| 2010/0187172 A1* | 7/2010 | Paulose et al. | 210/506 |
| 2010/0236620 A1* | 9/2010 | Nakanishi et al. | 136/256 |
| 2010/0269270 A1* | 10/2010 | Ma et al. | 8/495 |
| 2010/0320089 A1* | 12/2010 | Misra et al. | 205/109 |
| 2011/0127167 A1 | 6/2011 | Misra et al. | |
| 2011/0139626 A1* | 6/2011 | Saito et al. | 205/50 |
| 2011/0262771 A1* | 10/2011 | Trimmer et al. | 428/687 |
| 2012/0199189 A1* | 8/2012 | Jin et al. | 136/256 |
| 2013/0175177 A1* | 7/2013 | Mardilovich et al. | 205/50 |

OTHER PUBLICATIONS

Mohapatra et al., Double-side illuminated titania nanaotubes for high volume hydrogen generation by water splitting, Nanotechnology, vol. 18, No. 445705, Oct. 10, 2007, pp. 1-6.

Chen et al., Enhanced-Efficiency of Dye-Sensitized Solar Cells Using Anodic Titanium Oxide Nanotube Arrays, Journal of the Electrochemical Society, vol. 156, No. 9, Jul. 6, 2009, pp. C304-C312.

Li et al., Review of recent progress in solid-state dye-sensitized solar cells, Solar Energy Materials & Solar Cells, vol. 90, Jun. 28, 2005, pp. 549-573.

Li et al., One-step realization of open-ended $TiO_2$ nanotube arrays by transition of the anodizing voltage, Journal of the Ceramic Society of Japan, vol. 118, Apr. 2010, pp. 291-294.

Meen et al., Study of Different $TiO_2$ Electrode Structures on Dye-Sensitized Solar Cell, Key Engineering Materials, vols. 368-372, Feb. 11, 2008, pp. 1716-1719.

* cited by examiner

NANOSTRUCTURED FILMS AND RELATED METHODS

CROSS-REFERENCE TO RELATED APPLICATIONS

This application is a National Stage Entry of International Application No. PCT/US2011/045925, filed Jul. 29, 2011, which claims priority to U.S. Provisional Application No. 61/369,150, filed Jul. 30, 2010, the contents of each of which are herein incorporated by reference.

BACKGROUND

The continuous increase in global energy demand is forcing society to search for environmentally clean, sustainable and renewable energy sources. See Schipper, S. Meyer, R. Howarth and R. Steiner, *Energy Efficiency and Human Activity: Past Trends, Future Prospects* (Cambridge University Press, Cambridge, 1997) and K. Zweibel, *Harnessing Solar Power: The Photovoltaics Challenge* (Plenum Press, New York, 1990). Several alternate sources of energy such as wind, solar, hydro and biomass have been explored over the last several decades. Among all these unconventional energy sources, solar energy has emerged as a most practical alternative to conventional fossil-fuel based energy sources. The Sun provides $32 \times 10^{24}$ joules every year. See K. Zweibel, *Harnessing Solar Power: The Photovoltaics Challenge* (Plenum Press, New York, 1990). If even 0.01% of the Earth's surface was covered with 10% efficient solar cells, present energy needs would be fully satisfied. However, despite the continuously increasing interest in solar energy, the present solar cell technology is still not able to compete fully with the conventional fossil energy sources due to the high manufacturing costs.

In recent years, dye-sensitized solar cells (DSSCs) have received considerable attention as a cost-effective alternative to conventional solar cells. See B. O'Regan and M. Grätzel, "A low cost, high efficiency solar cell based on dye sensitized colloidal $TiO_2$ films", *Nature*, 353:737-739 (1991); M. K. Nazeeruddin, A. Kay, I. Rodicio, R. Humphrybaker, E. Muller, P. Liska, N. Vlachopoulos and M. Grätzel, "Conversion of light to electricity by cis-x2 bis(2,2'-bipyridyl-4,4'-dicarboxylate)-ruthenium(II), (x=Cl—, Br—, I—, Cn—, and Scn-) on nanocrystalline $TiO_2$ electrodes", *Journal of the American Chemical Society*, 115:6382-6390 (1993); M. Grätzel, "Photoelectrochemical cells", *Nature*, 414:338-344 (2001); B. A. Gregg, "Excitonic solar cells", *Journal of Physical Chemistry B*, 107:4688-4698 (2003); and M. Grätzel, "Dye-sensitized solar cells", *Journal of Photochemistry and Photobiology*, C 4:145-153 (2003). DSSCs operate on a process that is similar in many respects to photosynthesis, the process by which green plants generate chemical energy from sunlight. In particular, dye molecules absorb light in the visible region of the electromagnetic spectrum and then "inject" electrons into the nanostructured semiconductor electrode. See M. Grätzel, "Photoelectrochemical cells", *Nature*, 414: 338-344 (2001). This process is accompanied by a charge transfer to the dye from an electron donor mediator supplied by an electrolyte, resetting the cycle. DSSCs based on liquid electrolytes have reached efficiencies as high as 11% under AM 1.5 (1000 W $m^{-2}$) solar illumination. See B. A. Gregg, "Excitonic solar cells", *Journal of Physical Chemistry B*, 107:4688-4698 (2003) and M. Grätzel, "Dye-sensitized solar cells", *Journal of Photochemistry and Photobiology*, C 4:145-153 (2003). However, unfortunately liquid electrolyte based DSSCs have much smaller life times compared to their inorganic counterparts. This problem arises mostly because of the fact that all the present DSSCs use liquid electrolytes. Liquid electrolyte evaporates and causes leakage in the cell thereby limiting their stability and life span.

Figure 1:
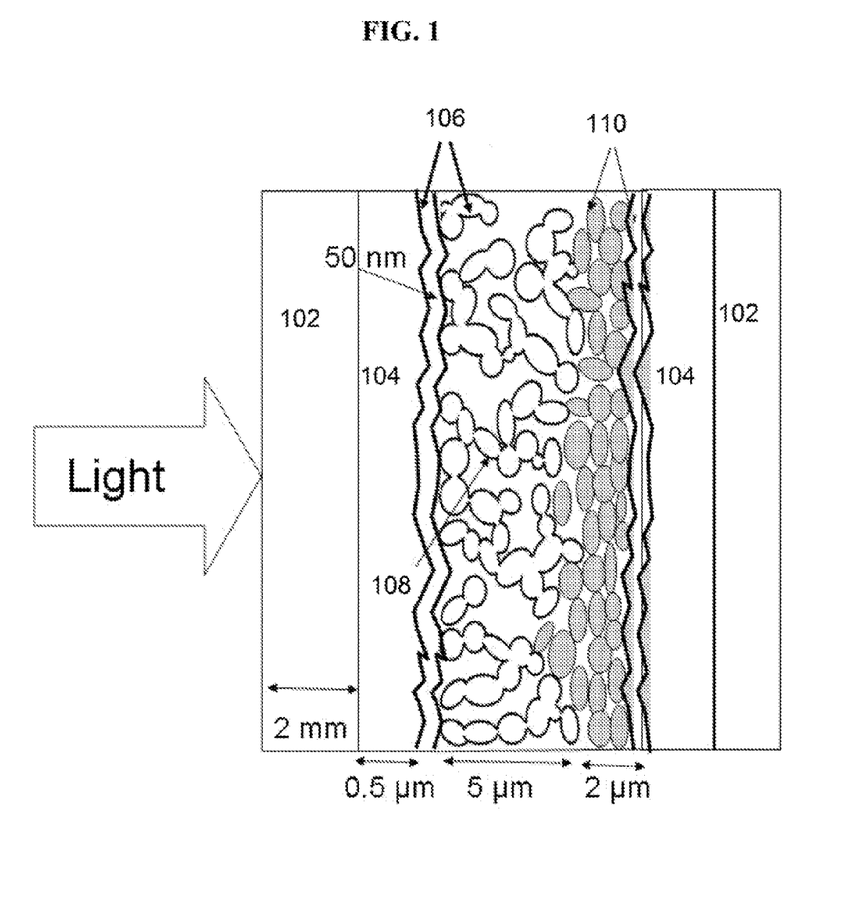
FIG. 1 is a schematic of a conventional solid state DSSC.

A conventional solid state DSSC 100 is shown in FIG. 1. The DSSC includes substrates 102 each coated with a transparent conducting oxide (TCO) 104 and a mesoporous $TiO_2$ network 106. The mesoporous $TiO_2$ is coated with dye 108. The DSSC also includes a solid electrolyte 110, $CuBO_2$. As shown in the figure, a problem with such solid state DSSCs is the difficulty in inserting the solid electrolyte inside the dye coated mesoporous $TiO_2$ network. Because of the poor incorporation and dispersion of the solid electrolyte inside the $TiO_2$ pores, the short circuit current is low, resulting in the low conversion efficiency of the cells.

SUMMARY

Provided herein are nanostructured films, devices incorporating the nanostructured films, and methods for making the nanostructured films. The disclosed methods are capable of forming large-area nanostructured films at rapid speeds. The methods, which allow for precise control over the morphology of the nanostructured films, are capable of providing nanostructured films with highly uniform nanofeatures. The nanostructured films possess a very large surface area while maintaining sufficient spacing and openings for loading with additional material, such as solid electrolyte. As a result, optoelectronic devices incorporating the nanostructured films, such as solid state DSSCs, are more stable and long-lived compared with conventional liquid state DSSCs and have much higher conversion efficiencies than conventional solid state DSSCs.

The nanostructured films include a plurality of nanowells, the nanowells having a pore at the top surface of the nanostructured film, the pore defining a channel that extends from the top surface of the nanostructured film downwardly towards the bottom surface of the nanostructured film. Possible shapes, dimensions, and distributions of the nanowells within the nanostructured film are described herein. Also described are various compositions for the nanostructured film, including metal oxide nanostructured films.

The methods of forming the nanostructured films include exposing a growth substrate to an anodizing bath, applying ultrasonic vibrations to the anodizing bath, and generating a current through the anodizing bath. Growth substrates and anodizing bath compositions are described herein. Other parameters of the method, including anodizing bath temperature, the amplitude and frequency of the ultrasonic vibrations, and methods for generating the current are described herein.

Optoelectronic devices, including solid-state DSSCs, incorporating the nanostructured films are also described herein.

DETAILED DESCRIPTION

Provided herein are nanostructured films, devices incorporating the nanostructured films, and methods for making the nanostructure films.

Nano Structured Films

Figure 2:
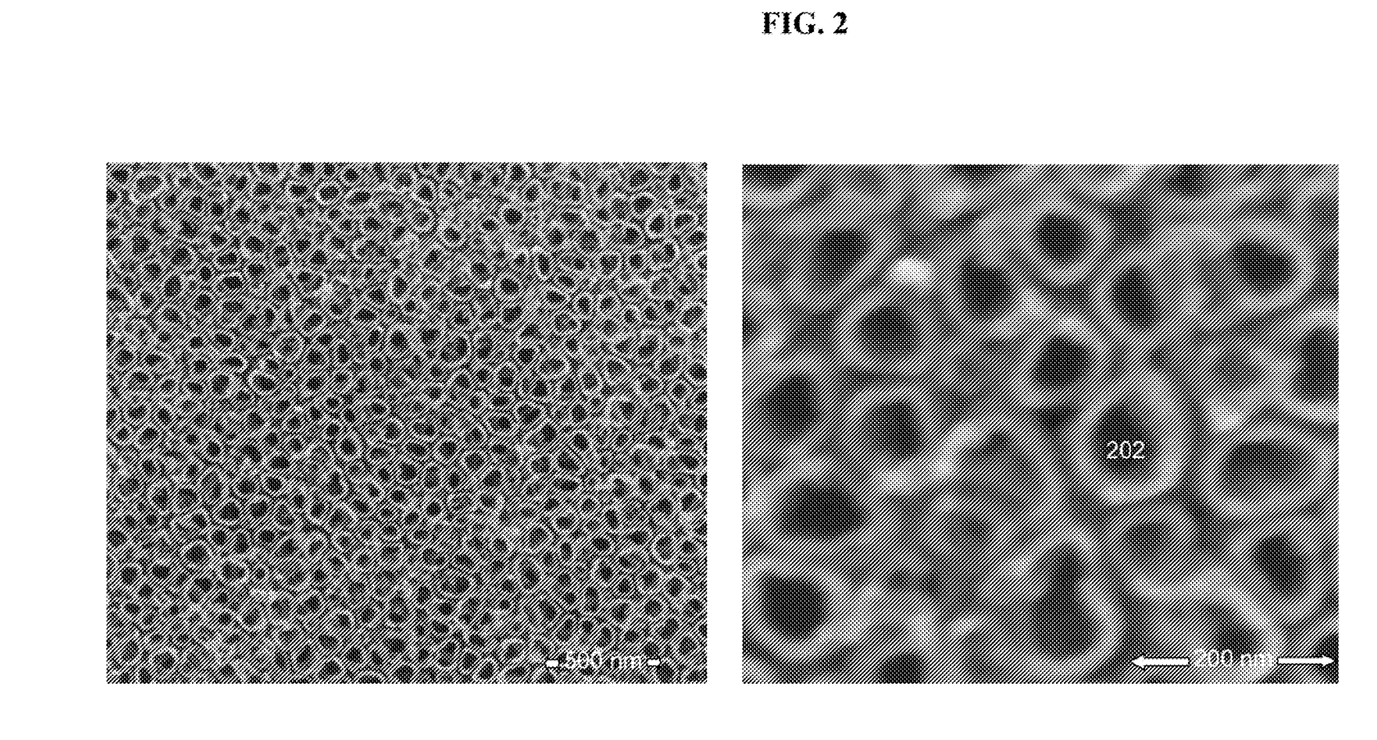
FIG. 2 shows SEM (scanning electron microscopy) images of a $TiO_2$ nanostructured film having a plurality of nanowells at low (A) and high (B) magnification.

The nanostructured films include a plurality of nanowells. A top view of exemplary nanostructured films is shown in FIG. 2. The nanowells include an opening 202 (i.e., pore) at the top surface of the film, the opening defining a channel that extends downwardly towards the bottom surface of the film. In some embodiments, the channel extends downwardly from the opening at the top surface of the film and continues to the bottom surface of the film (although not necessarily to the very bottom surface). In some embodiments, one or more or each of the nanowells are oriented along an axis that is perpendicular (although not necessarily perfectly perpendicular) to the plane of the nanostructured film. In some embodiments, the nanowells assume a regular, repeating, periodic, ordered arrangement throughout the nanostructured film such that the nanostructured film may be characterized as including an array of nanowells. Such embodiments may be distinguished from a random arrangement of nanowells throughout the nanostructured film.

Figure 3:
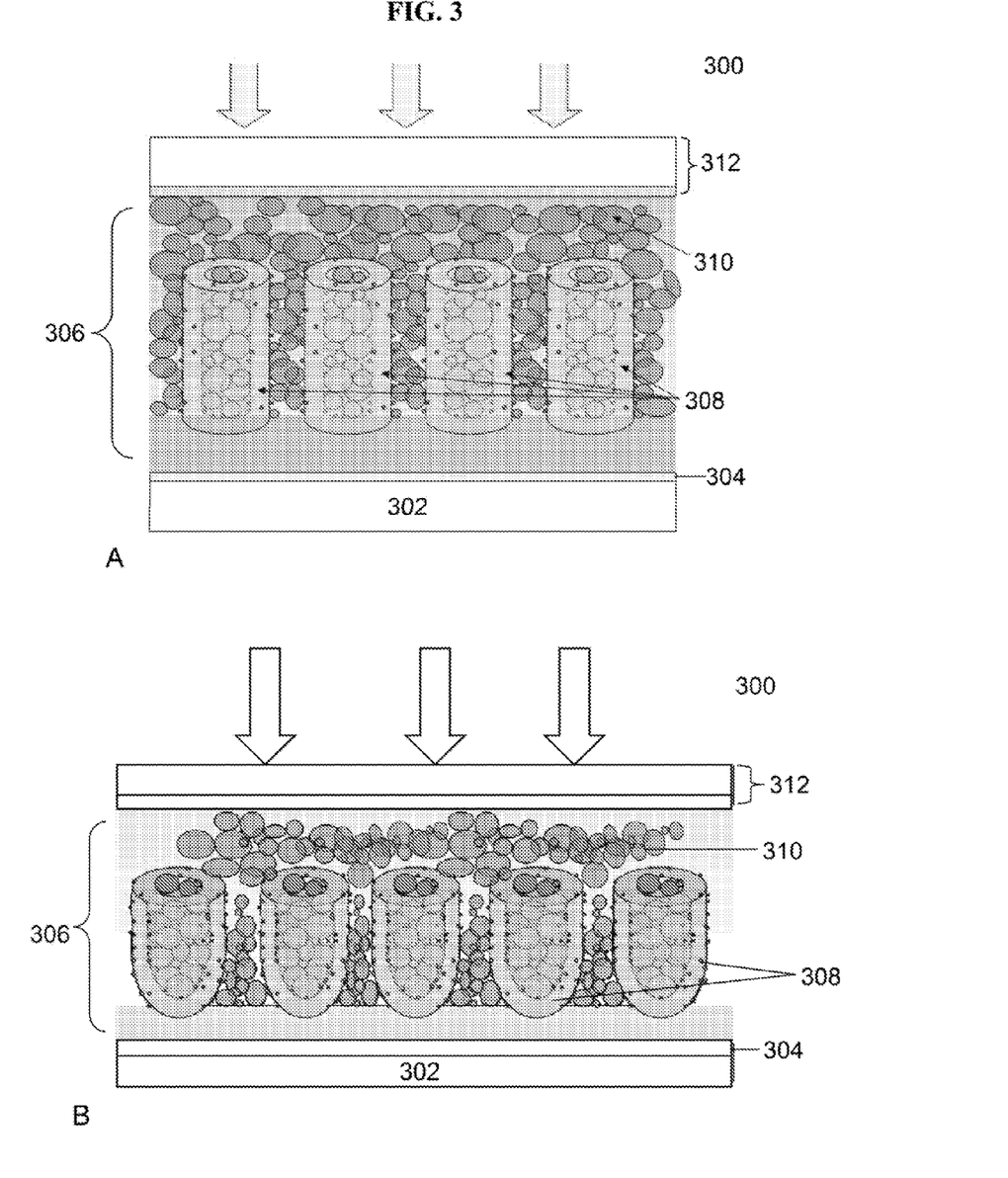
FIG. 3 shows schematics of solid state DSSCs incorporating a nanostructured film having a plurality of tubular nanowells (A) and tubular nanowells having tapered ends (B).

The nanowells may be characterized by their shape. A variety of shapes are possible. In some embodiments, the nanowells are tubular structures having a length, pore diameter, width and wall thickness. A schematic of a device 300 having tubular nanowells is provided in FIG. 3A. It is to be understood that the nanowells may not be perfectly tubular, unlike the tubular nanowells shown in FIG. 3A. For example, many of the nanowells shown in FIG. 2 are distorted from a perfectly tubular shape, as evidenced by pore openings that are not perfectly circular. In other embodiments, one or more of the nanowells are tubular structures having tapered ends. By "tapered" it is meant that a relevant dimension of one end of the nanowell, e.g., the width or pore diameter at one end of the nanowell, is smaller than the same dimension of the opposite end of the nanowell. In some embodiments, the width of one end of the nanowell is smaller than the width of the opposite end of the nanowell. In some embodiments, the end of the nanowell that is tapered is the end nearest to the bottom surface of the film. In some embodiments, the tapered end of the nanowell is closed. However, in other embodiments, the tapered end of the nanowell is open, although the pore diameter at the tapered end is smaller than the pore diameter at the opposite end of the nanowell. A schematic of a device 300 having tapered nanowells is provided in FIG. 3B. Tapered nanowells may exhibit the advantage of facilitating the loading of electrolyte, including solid electrolyte, and preventing the leaking of loaded electrolyte.

In some embodiments, the nanowells include ridges on the inner and/or outer walls of the nanowells. Thus, the inner and outer surfaces of the nanowells are not perfectly smooth. The ridges may be formed of the same material as the nanowells themselves. One nanowell may be interconnected to another nanowell through one or more of these ridges. Nanowells interconnected via ridges may exhibit the advantage of facilitating the flow of current through the nanostructured film.

The nanowells may be characterized by their dimensions, including a length, a pore diameter, a width, and a wall thickness. Each of these dimensions may vary. The lengths of the nanowells may be in the range from at least about 500 nm, about 500 nm to about 1 mm, about 1 μm to about 500 μm, about 5 μm to about 250 μm, or about 10 μm to about 100 μm, although other lengths are possible. This includes embodiments in which the length is about 1 μm, 5 μm, 10 μm, 50 μm, 100 μm, or 500 μm, although other values are possible. In some embodiments, the nanowells may be sufficiently long to extend from the top surface to the bottom surface of the nanostructured film. However, in other embodiments, the length of the nanowells is not as great as the thickness of the nanostructured film itself.

The diameter of the nanowell pore may be in the range from no more than about 150 nm, about 100 nm to about 150 nm, about 110 nm to about 140 nm, or 120 nm to about 130 nm, although other ranges are possible. This includes embodiments in which the diameter is about 110 nm, 120 nm, 130 nm, or 140 nm, although other values are possible. The diameter of the nanowell pore may be substantially constant down the length of the nanowell. In some embodiments, the diameter down the length of the nanowell does not vary by more than about ±20%. This includes embodiments in which the diameter does not vary by more than about ±15%, ±10%, ±5% or even ±2%.

The overall width of the nanowells may be in the range from no more than about 170 nm, about 110 nm to about 170 nm, about 120 nm to about 150 nm, or about 130 nm to about 140 nm, although other widths are possible. This includes embodiments in which the width is about 120 nm, 130 nm, 140 nm, 150 nm, or 160 nm, although other widths are possible. The width of the nanowells may be substantially constant down the length of the nanowells. In some embodiments, the width down the length of the nanowell does not vary by more than about ±20%. This includes embodiments in which the width does not vary by more than about ±15%, ±10%, ±5% or even ±2%.

Depending upon the pore diameter and the width, the wall thickness of the nanowells may be in the range from no more than about 50 nm, about 5 nm to about 50 nm, about 10 nm to about 40 nm, or about 20 nm to about 30 nm, although other wall thicknesses are possible. This includes embodiments in which the wall thickness is about 10 nm, 20 nm, 30 nm, or 40 nm, although other wall thicknesses are possible. The wall thickness of the nanowells may be substantially constant down the length of the nanowells. In some embodiments, the wall thickness down the length of the nanowell does not vary by more than about ±20%. This includes embodiments in which the wall thickness does not vary by more than about ±15%, ±10%, ±5% or even ±2%. In some embodiments, the walls of one or more nanowells are distinct from the walls of a neighboring nanowell. In other words, in some embodiments, at least some neighboring nanowells do not share walls.

In some embodiments, the nanowells in the nanostructured film are characterized by an average length, an average pore diameter, an average width, and an average wall thickness that is within any of the ranges disclosed above. In other words, a nanostructured film may have a population of nanowells, each nanowell characterized by a particular length, pore diameter, width and wall thickness that is within any of the ranges disclosed above. By "average length" (pore diameter, width, or wall thickness) it is meant the average length (pore diameter, width, or wall thickness) of the nanowells within the population.

The distribution of the nanowells within the nanostructured films may vary. The nanowells may be distributed throughout the entire nanostructured film, although other distributions are possible. An embodiment of nanostructured film having nanowells distributed throughout the film is shown in FIG. 2. The nanostructured film may also include areas with nanowells and areas without nanowells. The distance between neighboring nanowells, and thus, the nanowell density, may vary. In some embodiments, neighboring nanowells are widely separated. In other embodiments, as shown in FIG. 2, neighboring nanowells are closely packed. The distance between neighboring nanowells may be in the range from no more than about 100 nm, about 10 nm to about 100 nm, about 20 nm to about 80 nm or about 30 nm to about 60 nm, although other ranges are possible. This includes embodiments in which the distance is about 30 nm, 50 nm, or 80 nm, although other distances are possible. In some embodiments, the nanowells in the nanostructured film are characterized by an average distance between neighboring nanowells that is within any of the ranges disclosed above. "Average distance" has the same meaning as with respect to "average length" as described above. Neighboring nanowells may be bridged by the material forming the nanostructured film, e.g., through ridges as described above. In other words, in the schematics shown in FIG. 3, the space between nanowells may be at least partially filled with the material forming the nanostructured film so that one nanowell is connected to another nanowell along at least a portion of their lengths by this material.

It is to be understood that the characteristics of individual nanowells within a nanostructured film may vary. In other words, the shape, length, pore diameter, width, and wall thickness of one nanowell may be different from another nanowell in the nanostructured film. However, the disclosed methods are capable of providing highly uniform nanowells so that individual nanowells within the nanostructured film have similar shapes and dimensions. In some embodiments, the dimensions (e.g., the length, pore diameter, width, and wall thickness) of the individual nanowells within a nanostructured film do not vary by more than about ±20%. This includes embodiments in which the dimensions do not vary by more than about ±15%, ±10%, ±5% or even ±2%.

The disclosed nanostructured films may be distinguished from certain conventional nanostructured films. For example, the disclosed nanostructured films may be distinguished from mesoporous, microporous or nanoporous films such as the mesoporous $TiO_2$ film 106 shown in FIG. 1. For example, the openings in these mesoporous, microporous or nanoporous films may not extend across the film (i.e., from the top surface of the film to the bottom surface of the film). The openings may be characterized by a major axis (i.e., long axis) that is not oriented perpendicular to the plane of the film. An opening may exhibit variable dimensions, e.g., a variable diameter or width, along the length of the opening. The openings may be randomly distributed throughout the film. The openings may be highly non-uniform such that individual openings exhibit a large distribution of lengths, diameters or widths. Neighboring openings may share "walls." In some embodiments, the nanostructured film is not a mesoporous, microporous or nanoporous film. As another example, the nanostructured films may be distinguished from films composed of a population or array of nanotubes. Such nanotubes may be grown independently from one another via deposition of certain atoms/molecules over catalytic substrates. Such nanotubes may not be interconnected to one another along their lengths by the material forming the nanotubes. By contrast, the disclosed nanostructured films arise roughly simultaneously from electrochemical reactions that pattern an oxidized growth substrate with nanoscale features.

The composition of the nanostructured film may vary. The nanostructured film may be formed from a variety of metal oxides, including, but not limited to titanium oxide, zinc oxide, tin oxide, niobium oxide, tungsten oxide, strontium oxide, zirconium oxide, copper oxide or iron oxide. In some embodiments, the nanostructured film consists of, or consists essentially of, any of these metal oxides. Similarly, the thickness of the nanostructured film may vary. The thickness may be in the range from at least about 500 nm, about 500 nm to about 1 mm, about 1 µm to about 500 µm, about 5 µm to about 250 µm, or about 10 µm to about 100 µm, although other thicknesses are possible. This includes embodiments in which the thickness is about 1 µm, 5 µm, 10 µm, 50 µm, 100 µm, or 500 µm, although other values are possible.

The nanostructured film may be disposed over other material layers. For example, the nanostructured film may be disposed over a growth substrate. The growth substrate may be a substrate which, when subjected to the methods described below, generates the nanostructured film disposed over the substrate. The growth substrate may be formed of metal. A variety of metals may be used, including, but not limited to titanium, zinc, tin, niobium, tungsten, strontium, zirconium, copper, or iron. The nanostructured film may also be disposed over a supporting substrate. A variety of supporting substrates are possible. In some embodiments, the supporting substrate is a glass or flexible polymer substrate having transparent conducting oxide (TCO) coated thereon. A variety of transparent conducting oxides are possible, including, but not limited to indium tin oxide. Other possible supporting substrates include conducting or ferroelectric polymers such as polyvinylidene fluoride. Such a polymer can function as a charge carrier in an optoelectronic device.

Apart from nanowells, nanowires with no internal porosity and with faceted structure can be formed as nanostructured films.

Methods for Making the Nanostructured Films

Methods for making the nanostructured films are also provided. In a basic embodiment, the method involves exposing a growth substrate to an anodizing bath, applying ultrasonic vibrations to the anodizing bath, and generating a current through the anodizing bath. Any of the growth substrates described above may be used.

The anodizing bath includes an electrolyte solution. A variety of electrolytes and a variety of solvents may be used to form the electrolyte solution. Non-limiting examples of electrolytes include inorganic acids and organic acids. Hydrofluoric acid is a possible acid. Other possible acids include dimethyl sulfoxide (DMSO), potassium fluoride (KF), ammonium fluoride ($NH_4F$), phosphoric acid ($H_3PO_4$) and nitric acid ($HNO_3$). The electrolyte may be an ionic liquid. Possible ionic liquids include choline chloride and imadazolium salt-boron tetrafluoride based compounds such as 1-butyl-3-methylimidazolium hexafluorophosphate. Water, ethylene glycol, acetic acid, and ethanol are possible solvents. The concentration of the electrolyte in the anodizing bath may vary. In some embodiments, the concentration is in the range from about 0.5 wt % to about 5 wt %, about 1 wt % to about 4 wt %, or about 2 wt % to about 3 wt %. This includes embodiments in which the concentration is about 1 wt %, 2 wt %, 3 wt %, or 4 wt %, although other concentrations are possible. Nanostructured films formed at different concentrations of electrolyte are further described in the examples, below. The type of electrolyte used and the concentration of the electrolyte may be adjusted to control the rate of formation of the nanowells within the nanostructured film.

The temperature of the anodizing bath may also vary. The temperature, which affects the mobility of the electrolyte ions, can also be adjusted to control the rate of formation of the nanowells. In some embodiments, the temperature is in the range from about 5° C. to about 80° C., about 10° C. to about 70° C., about 20° C. to about 60° C., or about 30° C. to about 50° C. This includes embodiments in which the temperature is about 20° C., 35° C., 50° C., or 65° C., although other temperatures are possible.

The method involves applying ultrasonic vibrations to the anodizing bath. This may be accomplished by coupling the anodizing bath to an ultrasonic vibrator. Suitable ultrasonic vibrators include common bench top ultrasonic cleaners or an ultrasonic horn. In the case of ultrasonic cleaners, the anodizing bath may be placed in the cleaner such that vibrations are efficiently transferred from the ultrasonicator to the anodizing bath. In the case of an ultrasonic horn, the tip may be covered with teflon or a similar plastic to protect the tip from the electrolyte solution. The tip may be immersed in the anodizing bath and placed close to the anode during anodization. The use of ultrasonic vibrations during the formation of nanowells may provide nanowells that have uniform shapes and dimensions. The ultrasonic vibrations may also increase the rate of nanowell formation.

Both the amplitude and the frequency of the ultrasonic vibrations may vary. The amplitude of the ultrasonic vibrations may be adjusted to control the thickness of the walls of the nanowells and the spacing between nanowells formed in the nanostructured film. In some embodiments, the amplitude is in the range from about 1 µm to about 500 µm, about 5 µm to about 400 µm, about 10 µm to about 300 µm, about 20 µm to about 200 µm, or about 50 µm to about 100 µm. This includes embodiments in which the amplitude is 40 µm, 80 µm, 120 µm, 160 µm, 200 µm, 300 µm, or 400 µm, although other amplitudes are possible. The frequency of the ultrasonic vibrations may be adjusted to control the depth (i.e., the length) of the nanowells formed in the nanostructured film. In some embodiments, the frequency is in the range from about 15 kHz to about 2000 kHz, 30 kHz to about 1500 kHz, 50 kHz to about 1000 kHz, 100 kHz to about 500 kHz, or 200 kHz to about 400 kHz. This includes embodiments in which the frequency is about 100 kHz, 250 kHz, 500 kHz, 750 kHz, 1000 kHz, or 1500 kHz, although other frequencies are possible. The quality of nanostructured films formed without ultrasonic vibrations during nanowell formation is poor, e.g., the distribution of nanowells throughout the film is not uniform and the shape, length, pore diameter, width, and wall thickness of neighboring nanowells may not be uniform.

A variety of methods may be used to generate a current in the anodizing bath. In some embodiments, a cathode may be placed in the anodizing bath. The growth substrate may function as an anode. A voltage bias, such as a constant, direct current (DC) voltage bias, may be applied across the growth substrate and the cathode. The voltage bias, which may vary, can be adjusted depending upon the composition of the anodizing bath. In some embodiments, the voltage bias is in the range from about 10 V to about 60 V, about 20 V to about 50 V, or about 30 V to about 40 V. This includes embodiments in which the voltage bias is about 20 V, 30 V, 40 V, or 50 V, although other biases are possible.

The distance between the cathode and the growth substrate may vary. In some embodiments, the distance may be in the range from about 2.5 cm to about 15 cm or about 5 cm to about 10 cm. This includes embodiments in which the distance is about 5 cm, 8 cm, 11 cm, or 14 cm, although other distances are possible. The distance may be adjusted to control the rate of formation of the nanowells within the nanostructured film.

In addition, the surface characteristics of the cathode may vary. In some embodiments, the surface of the cathode is flat (although not necessarily perfectly flat). By "flat" it is meant that the surface of the cathode is made to be as flat as possible given the particular method used to generate the flat surface. In other embodiments, the surface of the cathode is rough. Rough cathodes may be formed by sand paper polishing of the cathodes or by sand blasting to provide a rough surface. The roughness of the cathode surface may be in the range from about 200 nm to about 5 µm, about 500 nm to about 2.5 µm, or about 800 nm to about 1 µm. This includes embodiments in which the roughness is about 500 nm, 1 µm, 2 µm, 3 µm, or 4 µm, although other values are possible. The roughness of the cathode surface may be adjusted to control the shape of the nanowells. For example, cathodes having rough surfaces may provide nanowells with tapered ends.

The length of time current flows through the anodizing bath may vary. The length of time can be adjusted to control the depth of the nanowells. In some embodiments, the length of time is in the range from about 20 minutes to about 72 hours, about 45 minutes to about 50 hours, about 5 hours to about 20 hours, or about 10 hours to about 15 hours. This includes embodiments in which the time is about 1 hour, 5 hours, 10 hours, 30 hours, 50 hours or 60 hours, although other times are possible.

Figure 4:
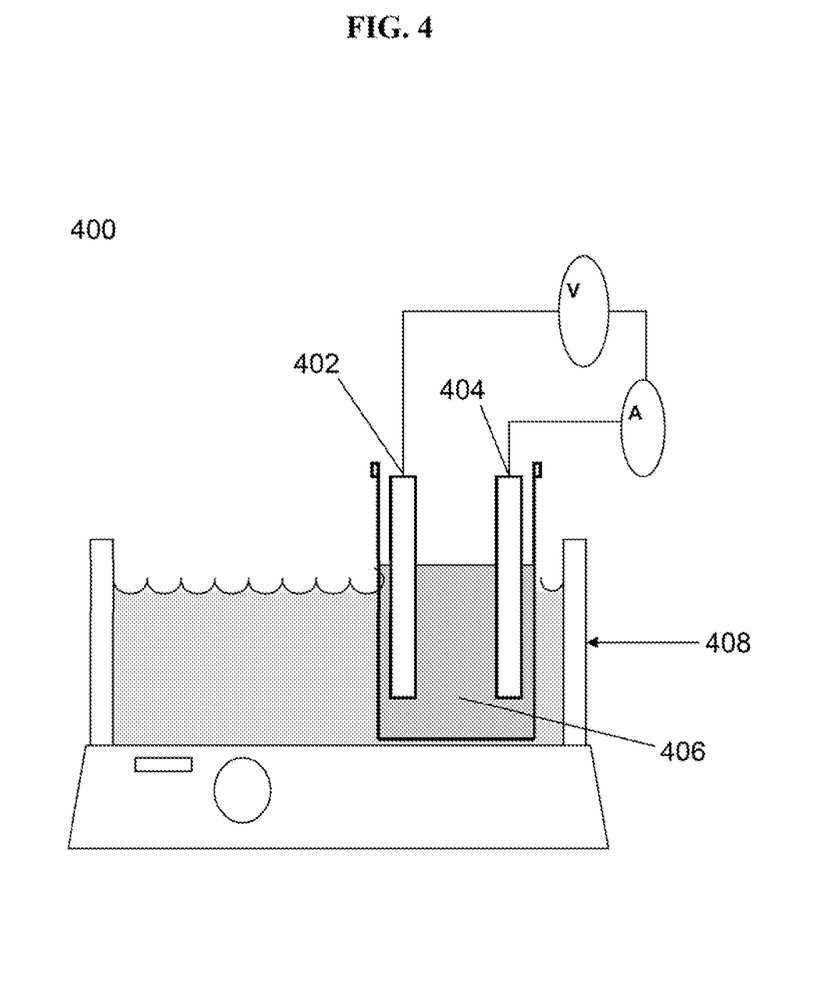
FIG. 4 shows an exemplary experimental apparatus for forming nanostructured films.

An embodiment of the disclosed methods using a suitable apparatus 400 is illustrated in FIG. 4. A constant DC voltage bias is applied to a titanium foil growth substrate 402 acting as an anode. The titanium foil may be cleaned and degreased prior to carrying out the method. A platinum foil 404 acts as a cathode. A constant DC voltage bias in the range of about 10 V to 25 V is applied across the electrodes in an anodizing bath 406 including a 0.5 wt % aqueous solution of hydrofluoric acid. Current flowing through the system is measured by an ammeter. The current may be monitored and controlled by a computer. The measured current may provide an indicator of nanowell formation. Ultrasonic vibrations are applied to the anodizing bath during formation of the nanowells using the ultrasonic vibrator 408.

Nanowell formation will be briefly described with reference to one possible metal oxide, $TiO_2$. As noted above, other metal oxides are possible. Nanowell formation involves multiple simultaneous reactions broadly classified under two processes, the oxidation of the titanium metal and the dissolution of titanium salt. In a first step, the current results in the formation of protons (Equation 1). In a second step, the titanium metal is oxidized, resulting in the formation of a thin $TiO_2$ layer on the titanium metal (Equation 2). Next, the bias voltage causes localized breakdown of the $TiO_2$ layer. Specifically, fluoride ions react with $TiO_2$ to form soluble titanium salt, thereby forming pits on the surface of the $TiO_2$ layer (Equation 3). These pits are the beginning of a nanowell. The dissolution rate at the base of the pits is faster than the edges of the nanowell due to localized higher pH. Finally, subsequent $TiO_2$ layers are formed and dissolved, with dissolution occurring preferentially in the base of the pits, leading to deeper (i.e., longer) nanowells. As described above, various parameters, including the anodizing bath composition, viscosity, conductivity, mobility of electrolyte ions, and temperature may be adjusted to control the rate of formation and the morphology of the nanowells within the nanostructured film. These parameters ultimately affect the rate of $TiO_2$ growth, the rate of $TiO_2$ dissolution, and the diffusion of the ionic species throughout the anodizing bath.

$$2H_2O \rightarrow O_2 + 4e + 4H^+ \quad \text{Equation 1}$$

$$Ti + O_2 \rightarrow TiO_2 \quad \text{Equation 2}$$

$$TiO_2 + 6F^- + 4H^+ \rightarrow TiF^{2-}_6 + 2H_2O \quad \text{Equation 3}$$

The ultrasonic vibrations can influence the formation of the nanowells in the nanostructured films. For example, the pits which give rise to the nanowells may have a tendency to form where ultrasonic waves interfere across the growth substrate. As described above, the amplitude and frequency of the ultrasonic vibrations also affects the dimensions of the nanowells.

Devices Incorporating the Nanostructured Films and Related Methods

The disclosed nanostructured films may be incorporated into a variety of devices, including optoelectronic devices. By "optoelectronic device," it is meant a device that produces light or converts light into electricity. Examples of such devices include photovoltaic cells (including solar cells), photodetectors, photodiodes, and light-emitting diodes. Specific examples of photovoltaic cells include, liquid or solid state dye sensitized solar cells (DSSCs), organic-inorganic hybrid photovoltaic devices, solid-state sensitized solar cells and photocatalytic hydrogen producers or converters. Typically, these optoelectronic devices include a first electrode, a second electrode, at least one layer of a nanostructured film disposed between the first and second electrodes, and a charge transport medium disposed between the first and second electrodes.

FIG. 3 shows the basic structure of solid-state DSSCs 300 including a nanostructured film. The cells include a transparent substrate 302 having a transparent conducting oxide coating 304; a $TiO_2$ nanostructured film 306 having a plurality of tubular nanowells 308; organic dye coated over the surface of the nanowells (shown as small circles); solid electrolyte 310; and a counter electrode 312 composed of glass coated with a transparent conducting oxide. A variety of transparent substrates, transparent conducting oxide coatings, organic dyes, solid electrolytes and counter electrodes may be used. The dye may be present as a monolayer of dye molecules on the nanowells. Suitable dyes are known and commercially available. These may include ruthenium based dyes including [(CN)(bpy)$_2$Ru—CN—Ru(d-cbpy)$_2$-NCRu(bpy)$_2$], [Ru(4,4-bis(carboxy)-bpy)$_2$(NCS)$_2$] and [Ru(2,2',2''-(COOH)$_3$-terpy)(NCS)$_3$], although other dyes are possible. The dyes may be applied to the nanostructured film by spray-coating or other methods. Cu(SCN), $CuBO_2$, $CuAlO_2$, and NiO are examples of suitable solid electrolytes, although other solid electrolytes are possible.

The disclosed nanostructured films have high surface areas while maintaining sufficient space and openings for loading solid electrolyte into the structure. Unlike conventional solid-state DSSCs, solid state electrolyte may be fully incorporated and distributed throughout the nanostructured films of the disclosed DSSCs. By contrast, solid state electrolyte is not able to be fully incorporated and distributed throughout the mesoporous film of the conventional DSSC shown in FIG. 1. As a result, the disclosed DSSCs have higher conversion efficiencies. Also provided herein is a method of loading the nanowells of the nanostructured films with solid electrolyte. A possible method involves impregnating the nanowells of a nanostructured film with the nanopowders of a solid electrolyte by the capillary effect. A nanostructured film may be exposed to an ultrasonicated suspension of solid electrolyte nanoparticles in a solvent. Any of the solid electrolytes described above may be used and any solvent suitable for such solid electrolytes may be used. The nanostructured film may be moved through the solid electrolyte suspension to facilitate incorporation of the solid electrolyte into the nanowells. The ultrasonication of the solid electrolyte suspension may provide a uniform distribution of the solid electrolyte within the nanowells of the nanostructured film. SEM images of nanostructured films impregnated with NiO solid electrolyte confirm the incorporation and distribution of the solid electrolyte throughout the nanostructured film, including NiO solid electrolyte nanoparticles deposited within the nanowells of the films.

The nanostructured films, devices incorporating the films, and related methods will be understood more readily by reference to the following examples, which are provided by way of illustration and are not intended to be limiting.

EXAMPLES

Materials and Methods

Titanium foil and Pt foil were purchased from Alfa Aesar. Titanium film was deposited on glass plate by ablating Titanium foil. A pulsed laser deposition system was used for this purpose. The ultrasonicator used in this study was Branson-200. Hitachi S3000-N scanning electron microscope was used for microstructure characterization. A Keithley Voltage source was used to apply bias during anodization. NiO nanopowder was purchased from Alfa Aesar while $CuBO_2$ and $CuAlO_2$ nanopowders were prepared by sol-gel technique. A calibrated solar spectrum light source (Solar Light Co, Inc.) was used for solar cell testing.

Example 1

Preparation of Nanostructured Films

A titanium film was degreased ultrasonically in acetone for 20 minutes. Using the apparatus shown in FIG. 4, the titanium film was dipped in an anodizing bath composed of 0.5 wt % hydrofluoric acid (HF) in deionized water and anodized by applying a bias of 20 V for 1 hour with platinum foil as a counter electrode. The temperature of the bath was room temperature. The titanium film acted as the anode and the platinum foil acted as the cathode. The surface of the cathode was flat. The distance between the cathode and anode was about 10 cm. During anodization, i.e., during generation of the current through the anodizing bath, the bath was continuously stirred using ultrasonic vibrations. Current during the formation of the film was monitored. Initially, the rate of decrease of current was very fast. During steady state deposition current readings were almost constant indicating growth of nanowells. After anodization, the titanium was allowed to rest in the anodizing bath for 20 minutes prior to removal. After removal, the titanium film was cleaned by dipping in deionized water and cleaning with ethanol to remove any traces of acids.

Figure 5:
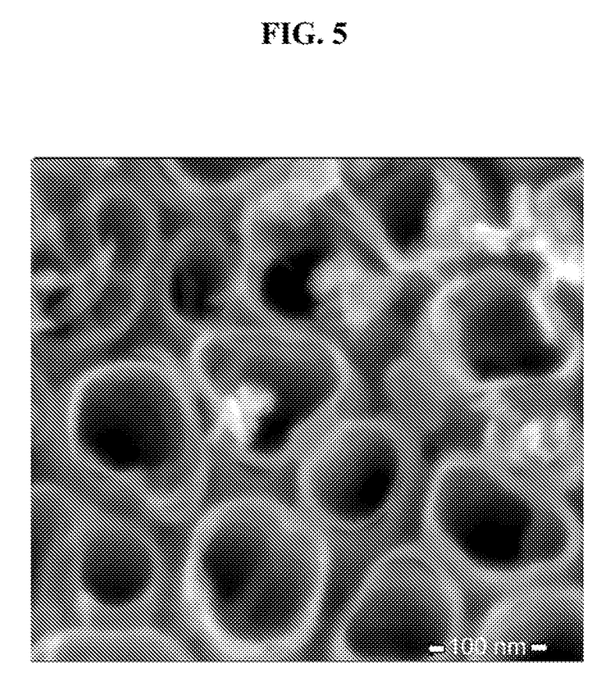
FIG. 5 shows an SEM image of a $TiO_2$ nanostructured film having a plurality of nanowells at high magnification.

SEM images of the nanostructured film are shown in FIG. 2 at low (A) and high (B) magnification. A SEM image of a nanostructured film formed at a more dilute (0.2%) concentration of HF is shown in FIG. 5. The figure shows the interconnection of neighboring nanowells via material between neighboring nanowells.

Example 2

Loading Nanostructured Films with Solid Electrolyte

P-type oxides such as NiO, $CuAlO_2$, or $CuBO_2$ were loaded onto the nanostructured films of Example 1 as follows. The p-type oxide was dispersed to form a dilute solution in either deionized water or absolute ethanol. The nanostructured films were dipped in the solution, slowly taken out of the solution and dried by blowing hot air. This process was repeated 2-3 times and then the film was dried to remove the solvent. SEM images of nanostructured films impregnated with NiO solid electrolyte confirm the incorporation and distribution of the solid electrolyte throughout the nanostructured film, including NiO solid electrolyte nanoparticles deposited within the nanowells of the films.

Example 3

Solar Cell Performance of Nanostructured Films

Figure 6:
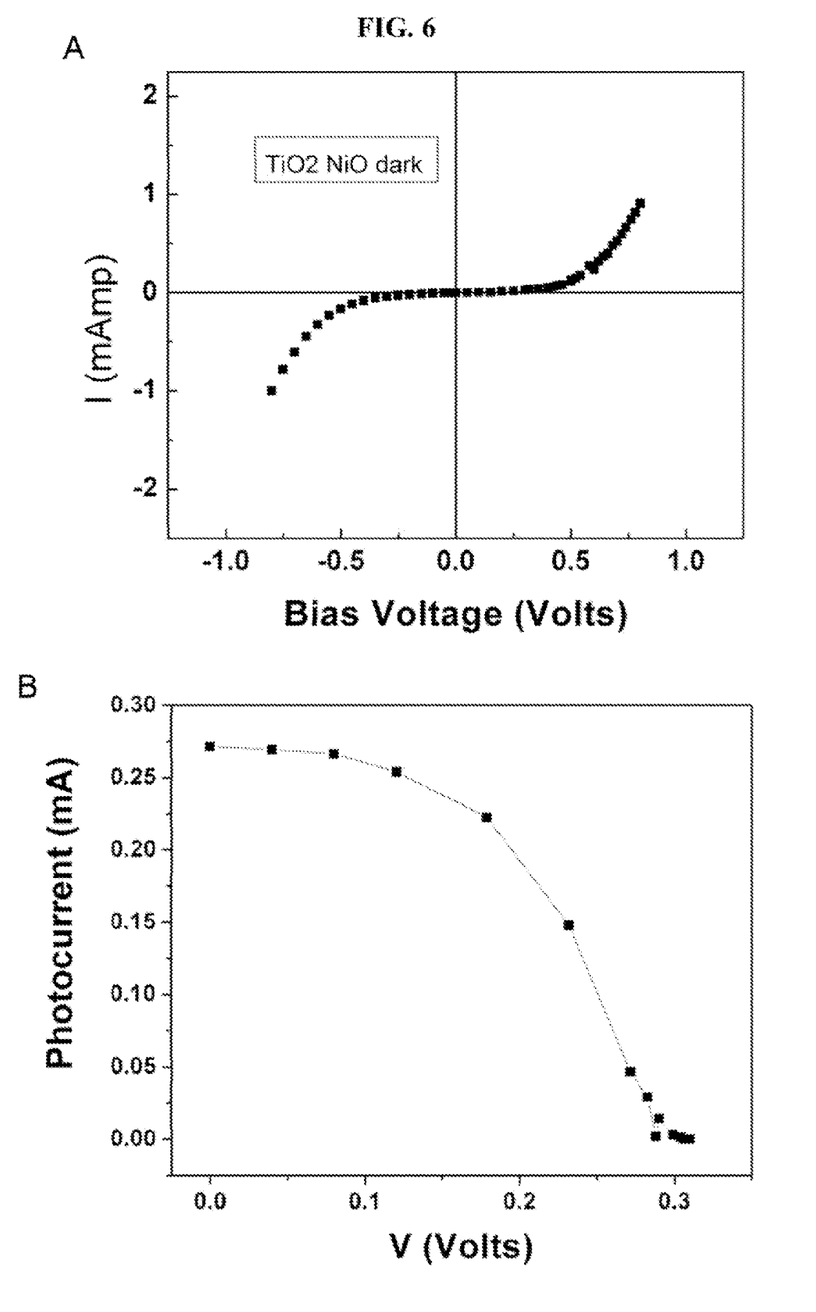
FIG. 6 shows the I-V characteristics (A) and the photocurrent-voltage characteristics (B) of a $TiO_2$ nanostructured film based solid state DSSC.
Figure 7:
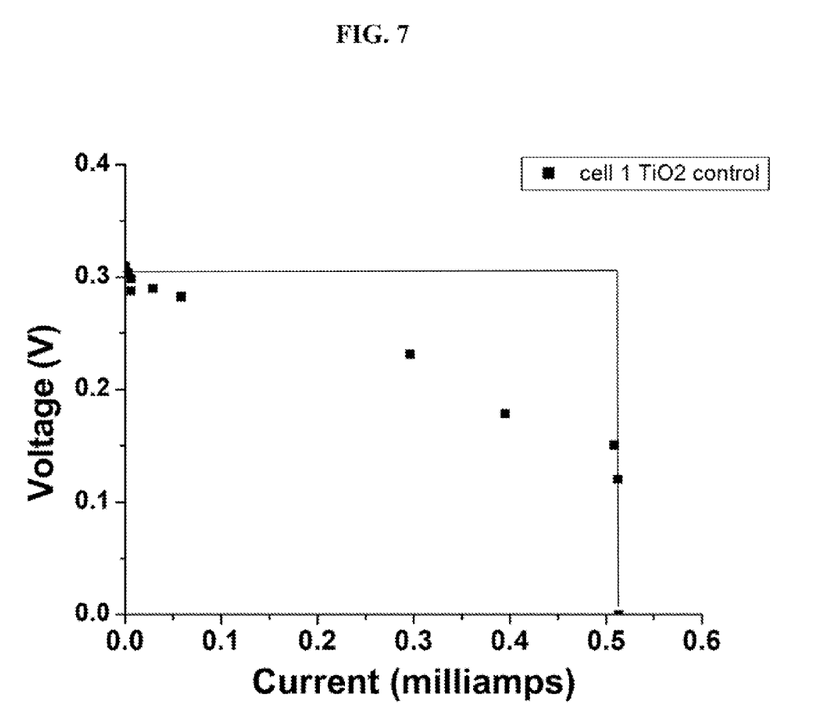
FIG. 7 shows the photocurrent-voltage characteristics recorded for a control solar cell using a $TiO_2$ nanostructured film.
Figure 8:
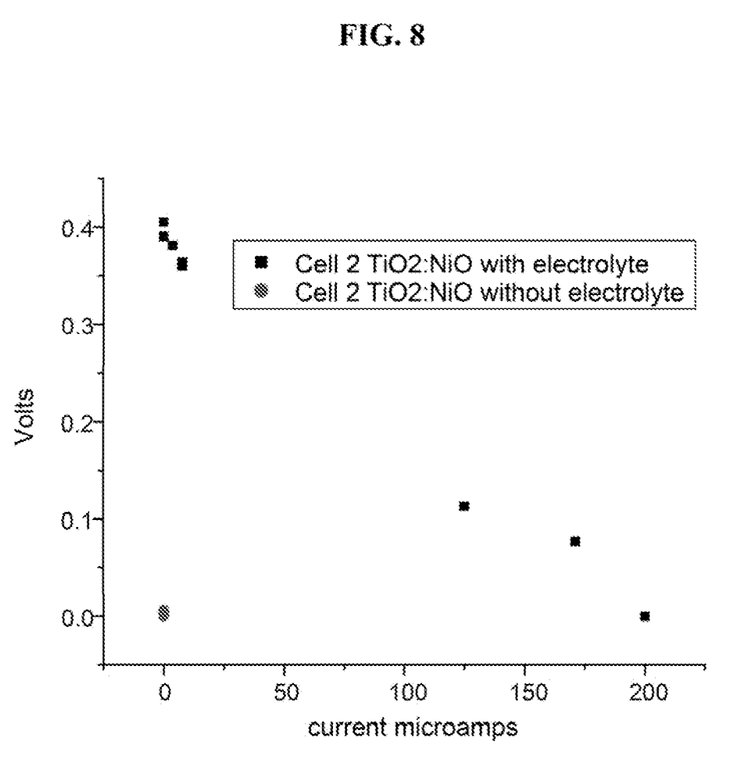
FIG. 8 shows the photocurrent-voltage characteristics recorded for a solar cell using a $TiO_2$ nanostructured film and NiO as the solid electrolyte.
Figure 9:
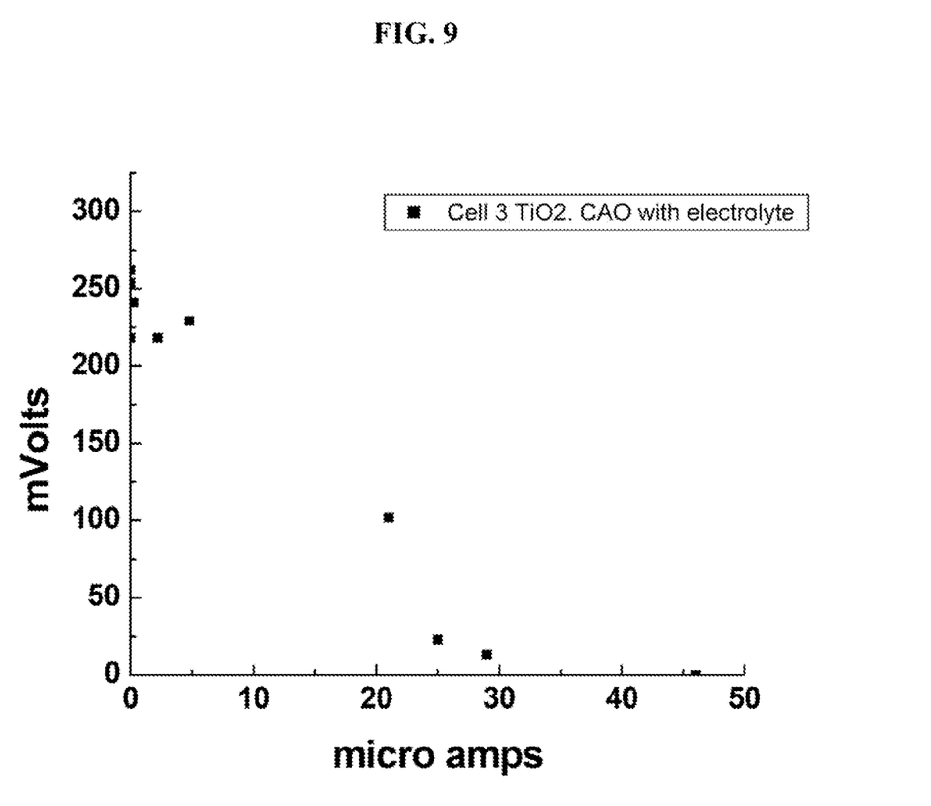
FIG. 9 shows the photocurrent-voltage characteristics recorded for a solar cell using a $TiO_2$ nanostructured film and $CuAlO_2$ as the solid electrolyte.
Figure 10:
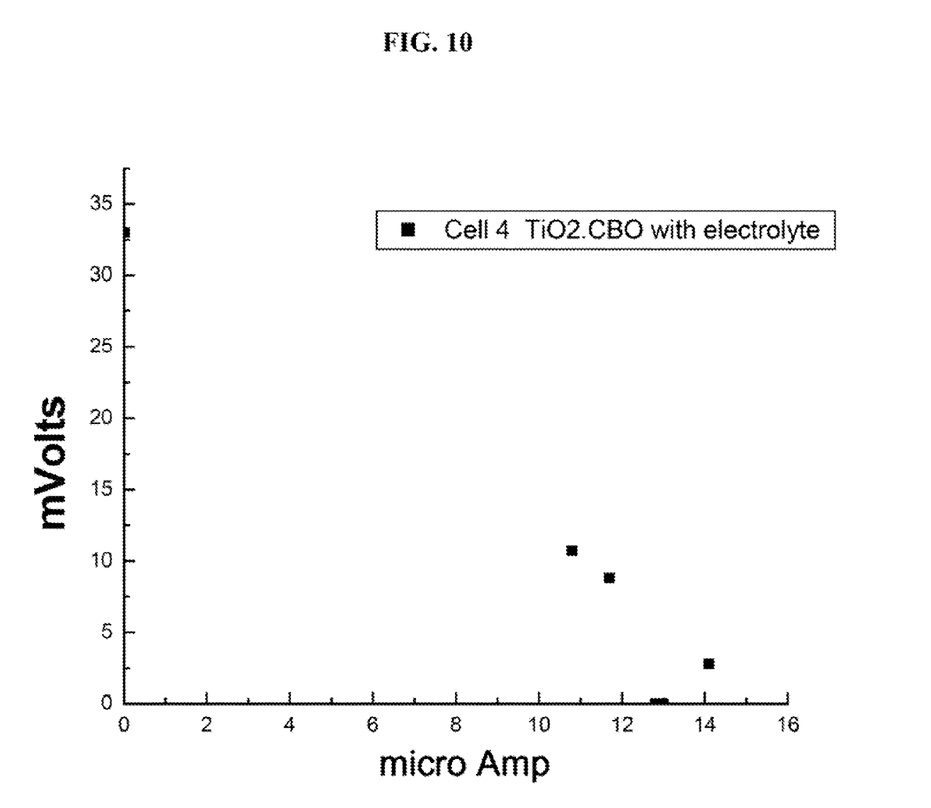
FIG. 10 shows the photocurrent-voltage characteristics recorded for a solar cell using a $TiO_2$ nanostructured film and $CuBO_2$ as the solid electrolyte.

For investigation of solar cell performance of the nanostructured films of Example 1, solid electrolyte loaded nanostructured $TiO_2$ films (see Example 2) were sensitized by ruthenium dye and tested with and without iodine electrolyte. The solid electrolyte was NiO, $CuAlO_2$ or $CuBO_2$. The I-V characteristics of a solar cell having a $TiO_2$ nanostructured film and NiO solid electrolyte is shown in FIG. 6A and the photocurrent-voltage characteristics are shown in FIG. 6B. The photocurrent-voltage characteristics for a control solar cell having a $TiO_2$ nanostructured film, but no solid electrolyte is shown in FIG. 7. The photocurrent-voltage characteristics for a solar cell having a $TiO_2$ nanostructured film and either NiO solid electrolyte, $CuAlO_2$ solid electrolyte or $CuBO_2$ solid electrolyte are shown in FIGS. 8-10, respectively.

The word "illustrative" or "exemplary" is used herein to mean serving as an example, instance, or illustration. Any aspect or design described herein as "illustrative" or "exemplary" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a nanostructured film, the method comprising:
providing an anode electrically coupled to a cathode through an anodizing bath, wherein the anode comprises a growth substrate, the anodizing bath comprising an electrolyte solution,
applying ultrasonic vibrations to the anodizing bath, and generating a current through the anodizing bath during the application of the ultrasonic vibrations to form the nanostructured film from the growth substrate,
wherein the current is generated by applying a voltage across the growth substrate and the cathode, the cathode having a surface roughness in the range of from about 200 nm to about 5 μm, and
wherein the nanostructured film comprises a plurality of tubular nanowells, the tubular nanowells each having a pore at the top surface of the nanostructured film, the pore defining a channel that extends from the top surface of the nanostructured film downwardly towards the bottom surface of the nanostructured film.

2. The method of claim 1, wherein the growth substrate is a metal growth substrate and the nanostructured film is a metal oxide nanostructured film.

3. The method of claim 1, wherein the growth substrate is a titanium growth substrate and the nanostructured film is a titanium oxide nanostructured film.

4. The method of claim 1, wherein the amplitude of the ultrasonic vibrations is in the range of from about 1 μm to about 500 μm.

5. The method of claim 1, wherein the frequency of the ultrasonic vibrations is in the range of from about 15 kHz to about 2000 kHz.

6. The method of claim 1, wherein the amplitude of the ultrasonic vibrations is in the range of from about 1 μm to about 500 μm; the frequency of the ultrasonic vibrations is in the range of from about 15 kHz to about 2000 kHz; the concentration of the electrolyte is in the range from about 0.5 wt % to about 5 wt %; the temperature of the anodizing bath is in the range from about 5° C. to about 80° C.; the current is generated by applying a voltage in the range of from about 10 V to about 60 V across the growth substrate and a cathode; the distance between the growth substrate and the cathode is in the range of from about 2.5 cm to about 15 cm; and the current is generated for a time period in the range of from about 20 minutes to 72 hours.

7. The method of claim 1, wherein one or more of the tubular nanowells have a tapered end.

8. A nanostructured film prepared according to the method of claim 1.

* * * * *